(12) United States Patent
Sugino

(10) Patent No.: US 10,504,637 B2
(45) Date of Patent: Dec. 10, 2019

(54) SHIELDED CONDUCTION PATH

(71) Applicant: SUMITOMO WIRING SYSTEMS, LTD., Yokkaichi-shi, Mie (JP)

(72) Inventor: Hidetoshi Sugino, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 15/766,620

(22) PCT Filed: Oct. 6, 2016

(86) PCT No.: PCT/JP2016/079715
§ 371 (c)(1),
(2) Date: Apr. 6, 2018

(87) PCT Pub. No.: WO2017/073281
PCT Pub. Date: May 4, 2017

(65) Prior Publication Data
US 2018/0301242 A1 Oct. 18, 2018

(30) Foreign Application Priority Data
Oct. 27, 2015 (JP) .................................. 2015-210408

(51) Int. Cl.
*H05K 9/00* (2006.01)
*H01B 7/20* (2006.01)
(Continued)

(52) U.S. Cl.
CPC ........... *H01B 7/20* (2013.01); *B60R 16/0215* (2013.01); *H01R 4/64* (2013.01); *H02G 1/08* (2013.01);
(Continued)

(58) Field of Classification Search
USPC ................................................. 361/816, 818
See application file for complete search history.

(56) References Cited

U.S. PATENT DOCUMENTS 9,917,434 B2 * 3/2018 George ............... H02G 15/117
10,147,522 B2 * 12/2018 Gundel ................. H01B 11/04
(Continued)

FOREIGN PATENT DOCUMENTS

JP     S57-162912 A    10/1982
JP     2004-171952 A    6/2004
(Continued)

OTHER PUBLICATIONS

Nov. 29, 2016 International Search Report issued in International Patent Application No. PCT/JP2016/079715.

*Primary Examiner* — Hung S. Bui
(74) *Attorney, Agent, or Firm* — Oliff PLC

(57) ABSTRACT

Provided is a shielded conduction path that enables a manufacturing operation to be performed easily and enables preventing positional shift. The shielded conduction path includes a shielding pipe that is shaped as a tube that surrounds electrical wires and is constituted by a pair of divided bodies that have divided ends that extend along the axial direction, and positioning members that are locked to the pair of divided bodies and are attached to the electrical wires. The two divided bodies are positioned relative to the electrical wires by the positioning members, and an operation of joining the two divided bodies together or the like can be performed without difficulty.

13 Claims, 7 Drawing Sheets

(51) Int. Cl.
*H02G 3/04* (2006.01)
*B60R 16/02* (2006.01)
*H01R 4/64* (2006.01)
*H02G 1/08* (2006.01)

(52) U.S. Cl.
CPC ............ *H02G 3/04* (2013.01); *H05K 9/0049* (2013.01); *H05K 9/0098* (2013.01)

(56) References Cited

U.S. PATENT DOCUMENTS

| | | | |
|---|---|---|---|
| 2015/0041175 A1* | 2/2015 | Nakai | B60R 16/0215 174/83 |
| 2015/0250079 A1* | 9/2015 | Sugino | H05K 9/0009 174/372 |
| 2015/0334882 A1* | 11/2015 | Sugino | B60R 16/0215 174/377 |
| 2018/0145430 A1* | 5/2018 | Yanai | B60R 16/0215 |
| 2018/0174718 A1* | 6/2018 | Sugino | H01B 17/583 |

FOREIGN PATENT DOCUMENTS

| | | | |
|---|---|---|---|
| JP | 2013-051800 A | 3/2013 | |
| WO | WO-2018131448 A1 * | 7/2018 | ............... H01B 7/18 |

* cited by examiner

SHIELDED CONDUCTION PATH

TECHNICAL FIELD

The present disclosure relates to a shielded conduction path that has a shielding function.

BACKGROUND ART

Conventionally, in a vehicle such as a hybrid vehicle, electrical wires have been routed under the floor of the vehicle in order to connect a device such as a high-voltage battery provided in the rear portion of the vehicle to a device such as an inverter or a fuse box provided in the front portion of the vehicle, for example. In the shielded conduction path disclosed in Patent Document 1 for example, electrical wire protection and noise blocking are achieved by bending a metal pipe in accordance with the electrical wire routing path, and inserting the electrical wires into the pipe.

CITATION LIST

Patent Documents

Patent Document 1: JP 2004-171952A

SUMMARY

Technical Problem

However, when the above-described shielded conduction path is manufactured, the electrical wires need to be inserted into a very long pipe that extends from the front portion of the vehicle to the rear portion, and thus there is a problem that the manufacturing operation is difficult.

To address this, if a configuration is employed in which the pipe is constituted by a pair of divided bodies that are divided along the axial direction, the electrical wires can be housed inside the pipe by first arranging the electrical wires in one divided body, and then joining the other divided body to the one divided body, thus eliminating the need for an operation for inserting the electrical wires into the pipe, and making it is possible to reduce the workload. However, when the operation of joining the two divided bodies is performed, if the positions of the divided bodies relative to the electrical wires is not defined, there is a problem that the two divided bodies become shifted in the axial direction, and the operation is difficult. There is also a need to devise a countermeasure for preventing positional shifting of the two divided bodies after being joined together.

The present disclosure was achieved in light of the above-described situation, and an object of the present disclosure is to provide a shielded conduction path that enables a manufacturing operation to be performed easily, and enables preventing positional shift.

Solution to Problem

A shielded conduction path according to the present disclosure includes: a shielding pipe that is shaped as a tube that surrounds an electrical wire, and is constituted by a pair of divided bodies each having a divided end that extends along an axial direction; and a positioning member that is locked to the pair of divided bodies and is to be attached to the electrical wire.

Advantageous Effects

According to the above configuration, by arranging the electrical wire so as to extend in one of the pair of divided bodies, and then joining the other divided body to the one divided body, the electrical wire is housed inside the shielding pipe, thus eliminating the need for an operation for inserting the electrical wire into the shield pipe.

Also, the positioning member is locked to the divided bodies in a state of being attached to the electrical wire, and therefore the positions of the divided bodies relative to the electrical wire are held at constant positions, thus making it possible to prevent positional shift of the two divided bodies at the time of the joining operation or after being joined.

DESCRIPTION OF EMBODIMENTS

Figure 1:
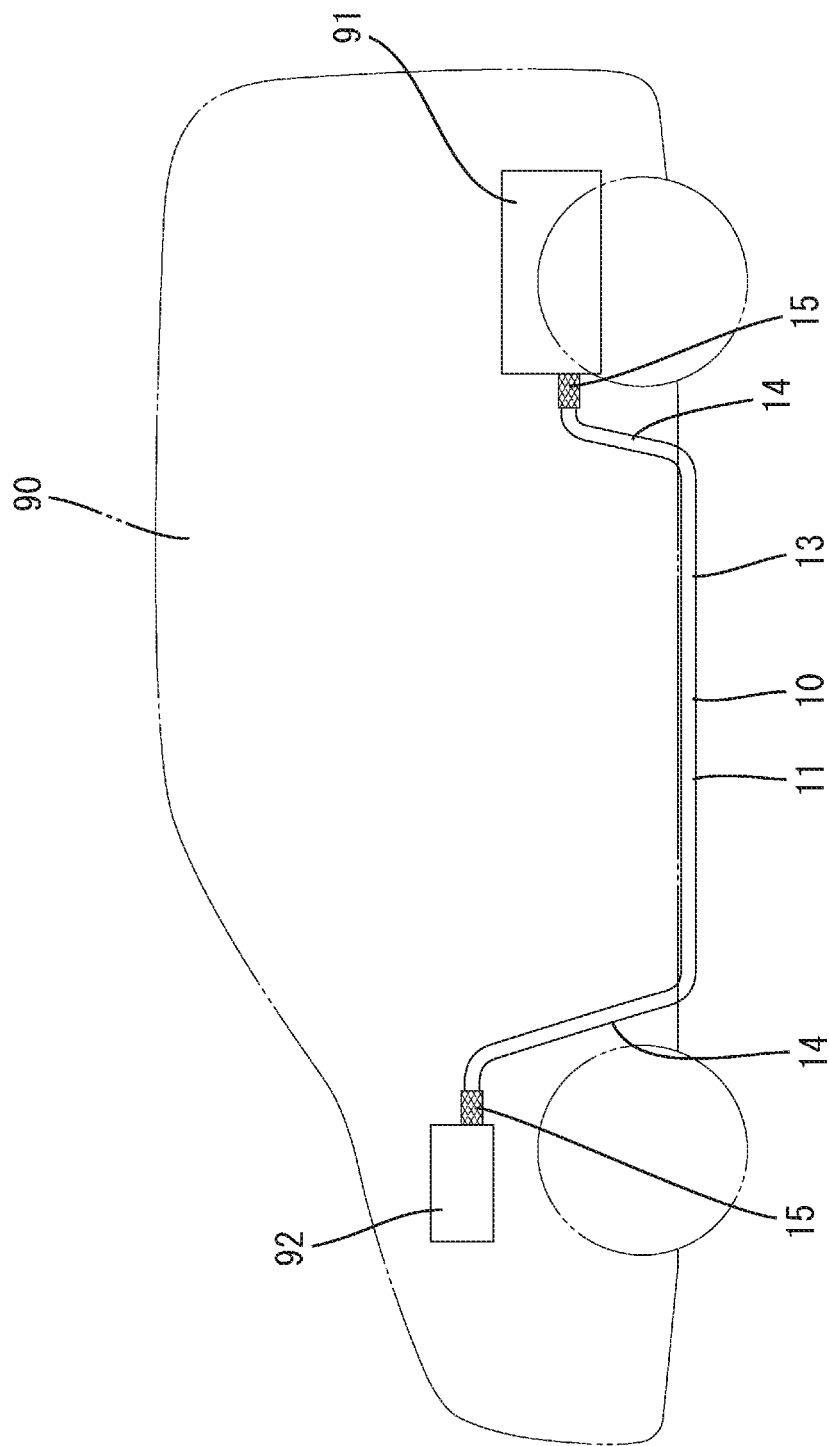
FIG. 1 is a schematic view of a routing path of a shielded conduction path according to a first embodiment.

Preferred aspects of the present disclosure will be described below.

The divided ends (edges) of the pair of divided bodies may be sealed by a weld portion. According to this, the sealed state of the divided ends of the two divided bodies is firmly maintained by the weld portion, and it is possible to prevent the formation of a gap between the divided ends of the two divided bodies when bending processing is performed on the shielding pipe, for example. In particular, in the case of the present disclosure, positional shift of the two divided bodies is restricted by the positioning member, thus making it possible to smoothly perform the operation of welding the weld portion.

A lapped region in which the pair of divided bodies are overlaid in an inward-outward direction may be provided, and a protection wall that covers an abutting portion of the divided ends from an inward side of the shielding pipe may be provided in the lapped region. The protection wall covers the abutting portion of the divided ends from the inward side of the shielding pipe, thus making it possible to prevent the electrical wire in the shield pipe from being influenced by heat generated in the operation of welding the weld portion.

The electrical wire may be constituted by a single wire and a stranded wire that is connected to a lengthwise end portion of the single wire, and the shielding pipe may cover the single wire over an entire length, and surround a connection region of the single wire and the stranded wire. Due to the single wire being included in the electrical wire, it is possible to suppress the cost to an inexpensive cost, and it is possible to reduce the diameter in the single wire portion. Also, the entire length of the small-diameter single wire is covered by the shielding pipe, and thus is held stably and reliably. Furthermore, the connection region of the single wire and the stranded wire is also protected by being surrounded by the shielding pipe. In particular, in the case of the present disclosure, the shielding pipe can be constituted by joining the two divided bodies after performing the connection operation in the connection region of the single wire and the stranded wire, thus eliminating the need to perform the troublesome operation of inserting the connection region into the shield pipe after being formed.

The positioning member may have a tubular portion that is shaped as a tube and extends along an inner circumferential surface of the shielding pipe, and a step portion may project from an outer circumferential surface of the tubular portion and oppose an axial-direction edge of the pair of divided bodies. According to this, even if an edge is formed at an axial-direction edge of the divided bodies, the edge can be hidden by the step portion, and it is possible to avoid the case where the edge interferes with a peripheral component or the like.

The positioning member may have a tubular portion that is shaped as a tube and extends along an inner circumferential surface of the shielding pipe, a locking projection portion may be provided on an outer circumferential surface of the tubular portion, and a lock-receiving portion that receives the locking projection portion may be provided in the pair of divided bodies. The locking projection portion is provided on the outer circumferential surface of the tubular portion, thus eliminating a reduction in space for arranging the electrical wire in the shielding pipe due to the locking projection portion projecting inward in the tubular portion.

First Embodiment

Hereinafter, a first embodiment of the present disclosure will be described with reference to FIGS. 1 to 8. As shown in FIG. 1, a shielded conduction path 10 of the first embodiment is routed under the floor of a vehicle body 90 of a vehicle such as a hybrid vehicle in order to connect a device 91 such as high-voltage battery provided in the rear portion of the vehicle body 90 to a device 92 such as an inverter or a fuse box provided in the front portion of the vehicle body 90, for example.

Figure 5:
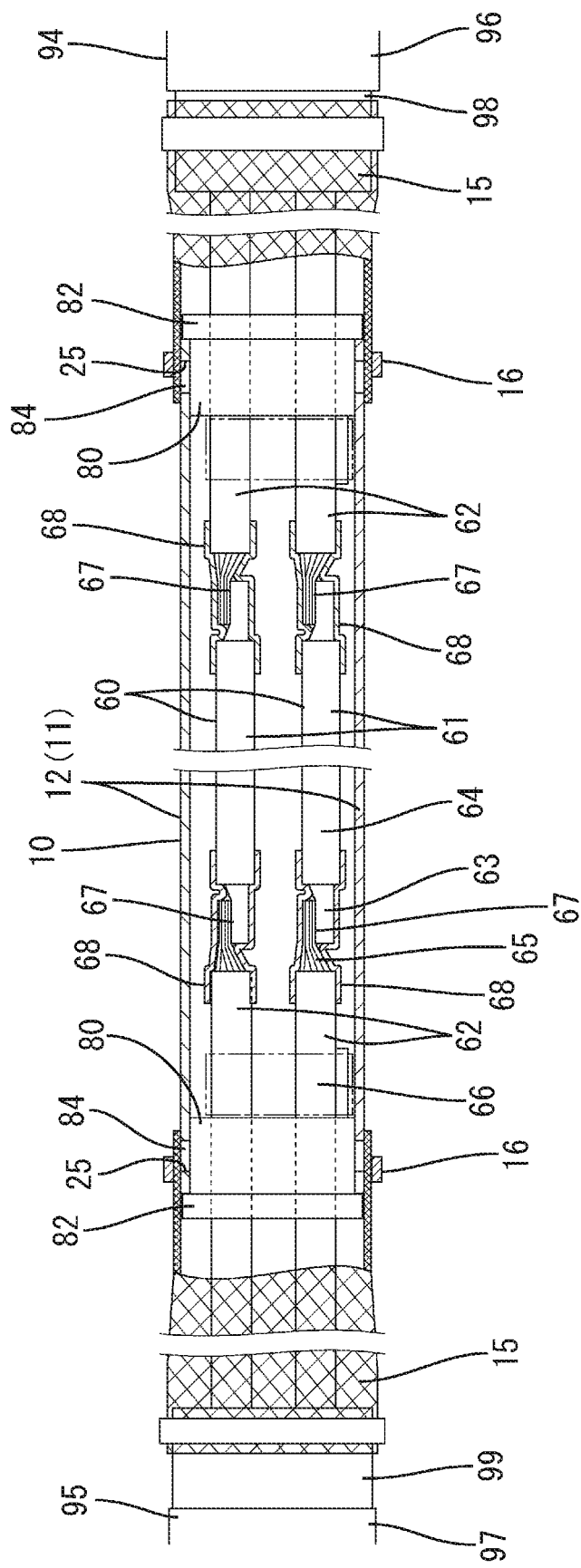
FIG. 5 is a side view of the structure inside a shielding pipe in FIG. 4.

As shown in FIG. 5, the shielded conduction path 10 includes a shielding pipe 11 that is obtained by joining a pair of divided bodies 12, electrical wires 60 that are inserted into the shielding pipe 11, and positioning members 80 for positioning the two divided bodies 12 relative to the electrical wires 60.

The electrical wires 60 are each constituted by a single wire 61 and stranded wires 62 that are respectively connected to two end portions in the length direction of the single wire 61 (forward-rearward direction). The stranded wires 62 have flexibility so as to be bent more easily than the single wire 61. In the case of the first embodiment, two electrical wires 60, each constituted by a single wire 61 and stranded wires 62, are routed in parallel, the single wires 61 are routed along the underside (a portion corresponding to a later-described lowest portion 13) of the floor of the vehicle body 90, and the stranded wires 62 are routed so as to bend at sites (portions corresponding to later-described rising portions 14) near the devices 91 and 92 in the front portion and the rear portion of the vehicle body 90.

Each single wire 61 is constituted by one core wire 63 that is made up of an electrically-conductive conductor (copper, aluminum, etc.), and a sheath 64 that is made of an insulating resin and surrounds the core wire 63. Also, the single wire 61 has a region in which the core wire 63 is exposed in the two lengthwise end portions due to stripping the sheath 64 in the two lengthwise end portions.

Each stranded wire 62 is constituted by multiple core wires 65 (similarly to the above description, electrically-conductive conductors) that are twisted together, and a sheath 66 that is a made of an insulating resin and surrounds the core wires 65 as a group. Also, one lengthwise end portion of the stranded wire 62 is connected to a terminal fitting (not shown), and the terminal fitting is connected to the device 91 or 92 by being housed in a housing 96 or 97 of a device-side connector 94 or 95 provided in the device 91 or 92. The other lengthwise end portion of the stranded wire 62 is stripped to expose the core wires 65. The exposed region of the core wire 63 of the single wire 61 is overlaid on the exposed region of the core wires 65 of the stranded wire 62, and soldering is performed on the overlaid portions of the core wires 63 and 65, thus forming a connection region 67 in which the single wire 61 and the stranded wire 62 are electrically and mechanically connected. A protection member 68 such as a heat shrink tube is affixed to the outer circumferential surface of the connection region 67 so as to prevent a short-circuit connection between the two electrical wires 60.

The shielding pipe 11 is made of a metal (iron, aluminum, copper, stainless steel, etc.), is shaped as a tube (specifically a circular tube) that surrounds the two electrical wires 60, surrounds both of the single wires 61 over the entire length thereof, and surrounds a range from the connection regions 67 to the other lengthwise end portions of the stranded wires 62 as a group. This shielding pipe 11 is bent three-dimensionally along the routing path of the electrical wires 60, and, as shown in FIG. 1, has a lowest portion 13 that is arranged at the lowest position in the routing path, and rising portions 14 that rise diagonally from the two lengthwise (axial direction) end portions of the lowest portion 13 toward the devices 91 and 92 respectively.

As shown in FIG. 5, portions of the two electrical wires 60 excluding the other lengthwise end portions of the stranded wires 62 are not surrounded by the shielding pipe 11, and are surrounded as a group by braided members 15. Each braided member 15 is tube-shaped and formed by electrically-conductive metal strands (e.g., made of copper) that are woven into a mesh. Note that instead of the braided members 15, metal foil or the like may be wrapped around these portions.

One lengthwise end portion of each of the braided members 15 is conductively fixed to a shield shell 98 or 99 of the device-side connector 94 or 95, and the other lengthwise end portion of each of the braided members 15 is placed around the outer circumferential surface of an end portion of the shielding pipe 11 and conductively fixed thereto by being crimped with a metal band 16.

Figure 6:
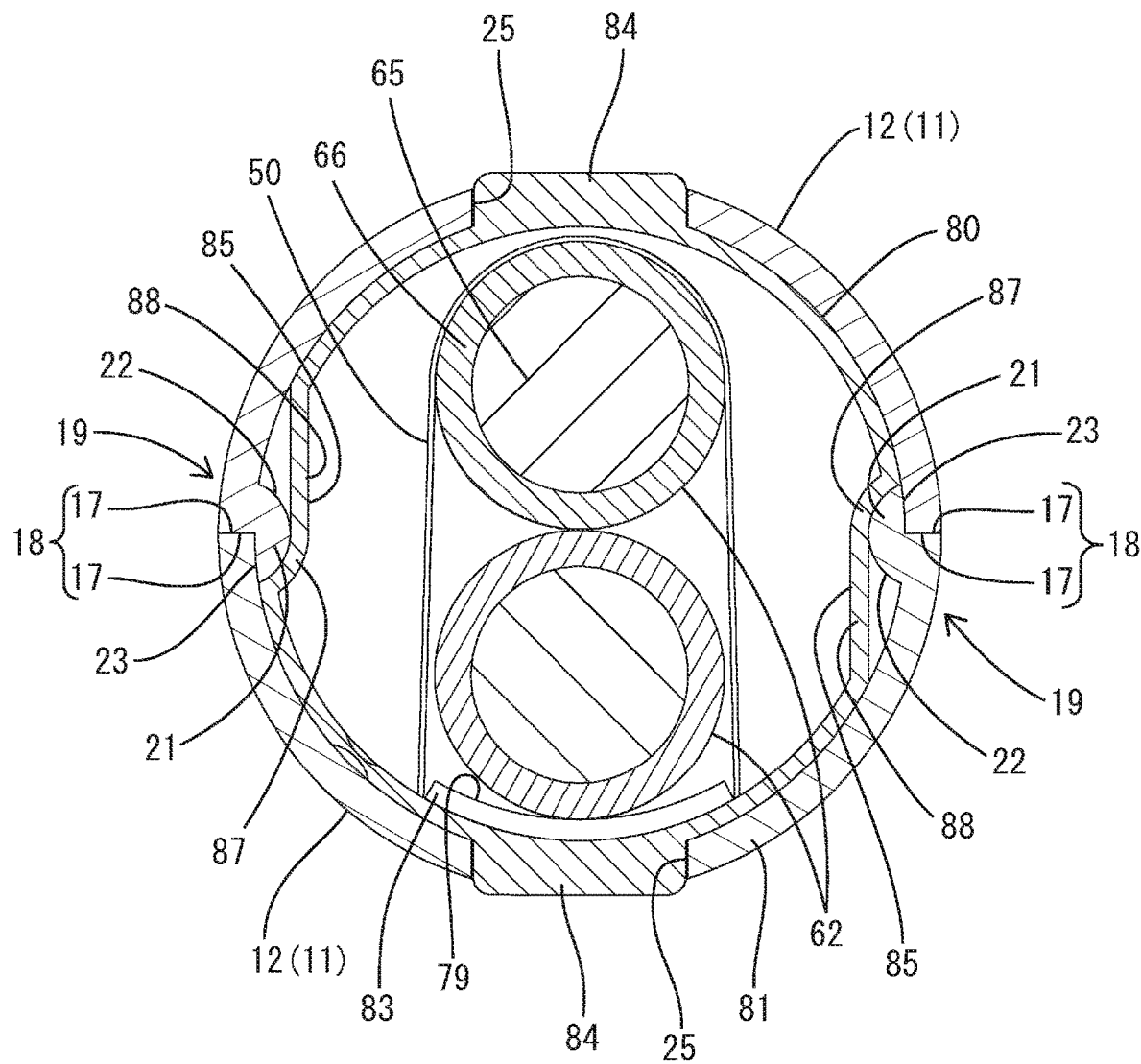
FIG. 6 is a cross-sectional view taken along line A-A in FIG. 3.

The pair of divided bodies 12 that constitute the shielding pipe 11 can be divided along the length direction (axial direction) of the shielding pipe 11, and are formed with the same half-circle cross-sectional shape as each other. These divided bodies 12 are formed by extrusion molding. As shown in FIG. 6, the two circumferential ends of each divided body 12 are divided ends (edges) 17 that extend along the length direction of the shielding pipe 11. The two divided bodies 12 are joined together in a manner in which the divided ends (edges) 17 abut against each other. Note that in the following, an abutting portion 18 refers to a portion where the divided ends 17 of the two divided bodies 12 abut against each other.

Out of the two circumferential edge portions of each of the two divided bodies 12, one edge portion is located inward (inward in the diameter direction of the shielding pipe 11) of the other edge portion, and a lapped region 19 is formed by two edge portions being overlaid on each other in the inward-outward direction. A protection wall 21 is provided on one edge portion of the lapped region 19 and extends so as to protrude inward in the shielding pipe 11 and cover the other edge portion from the inward side. In the case shown in FIG. 6, the protection wall 21 is provided at the edge portion on the left side, in the diagram, of the upper divided body 12, and also at the edge portion on the right side, in the diagram, of the lower divided body 12; the protection wall 21 of the upper divided body 12 covers the edge portion on the left side, in the diagram, of the lower divided body 12 from the inward side, and the protection wall 21 of the lower divided body 12 covers the edge portion on the right side, in the diagram, of the upper divided body 12 from the inward side.

More specifically, each protection wall 21 has a portion that protrudes inward in the shielding pipe 11 and is thick at one edge, and has a curved surface 22 that is curved (more specifically arc-shaped) and protrudes inward in the shielding pipe 11. The protection wall 21 also has a flat contact surface 23 that abuts against the inner surface of the other edge of the other divided body 12.

The abutting portions 18 of the divided ends 17 of the two divided bodies 12 are covered and hidden by the protection walls 21 from the inward side. The outer surface of the other edge portion of the lapped region 19 of each divided body 12 is substantially planar with and continuous with the outer circumferential surface that is adjacent to the divided body 12, thus maintaining a true circle shape for the entirety of the outer circumferential surface of the shielding pipe 11.

A weld portion 24 (although not shown in detail, see FIGS. 3 and 4) is formed over the entire length of each of the abutting portions 18 of the lapped regions 19 of the two divided bodies 12 by performing welding such as laser welding that is performed on the outer side. The abutting portions 18 of the divided ends 17 of the two divided bodies 12 are sealed by the weld portions 24. Note that due to the weld portions 24 being formed by laser welding or the like, it is possible to avoid the case where protrusions are formed on the outer circumferential surface of the shielding pipe 11, and it is possible to maintain a true circle shape for the outer circumferential surface of the shielding pipe 11.

As shown in FIG. 6, a circular lock-receiving portion 25 is provided penetrating a substantially circumferentially central portion in each of two lengthwise end portions of each of the divided bodies 12. The lock-receiving portions 25 of the two divided bodies 12 are arranged opposing two ends in the diameter direction (upper and lower ends in FIG. 6) of the shielding pipe 11 at the time of joining. Later-described locking projection portions 84 of the positioning member 80 can be mated to the lock-receiving portions 25.

Figure 7:
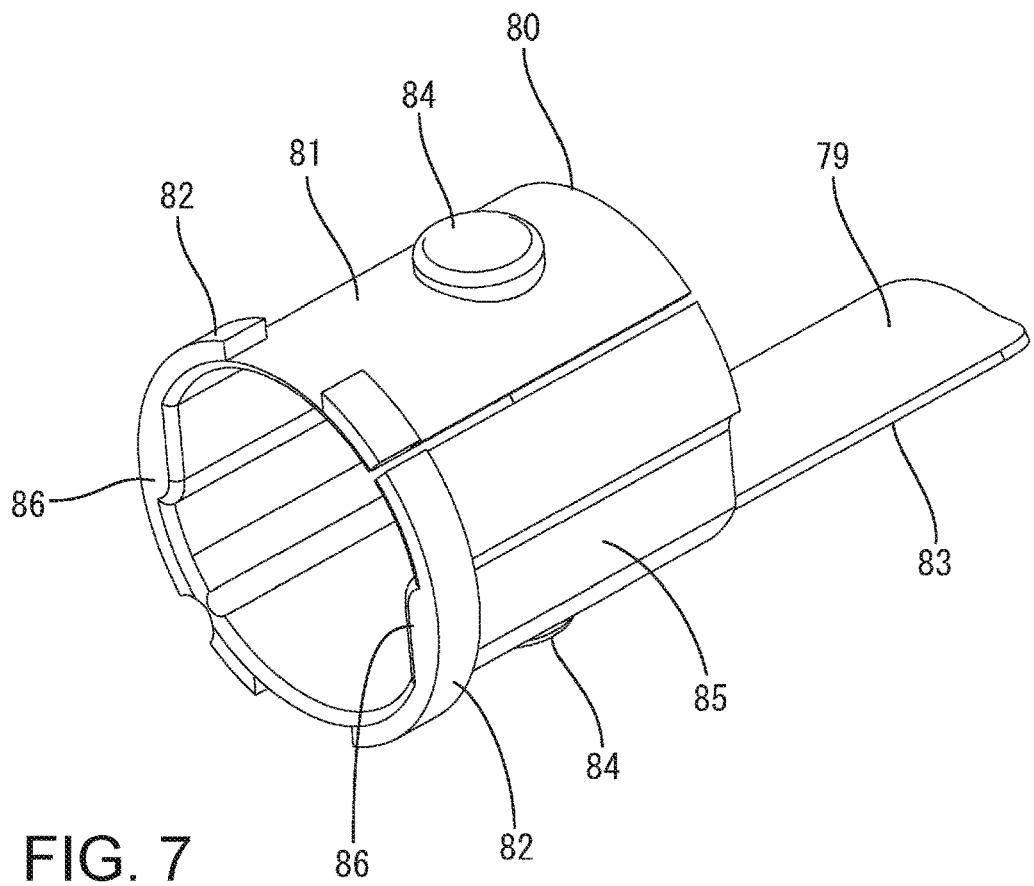
FIG. 7 is a perspective view of a positioning member.
Figure 8:
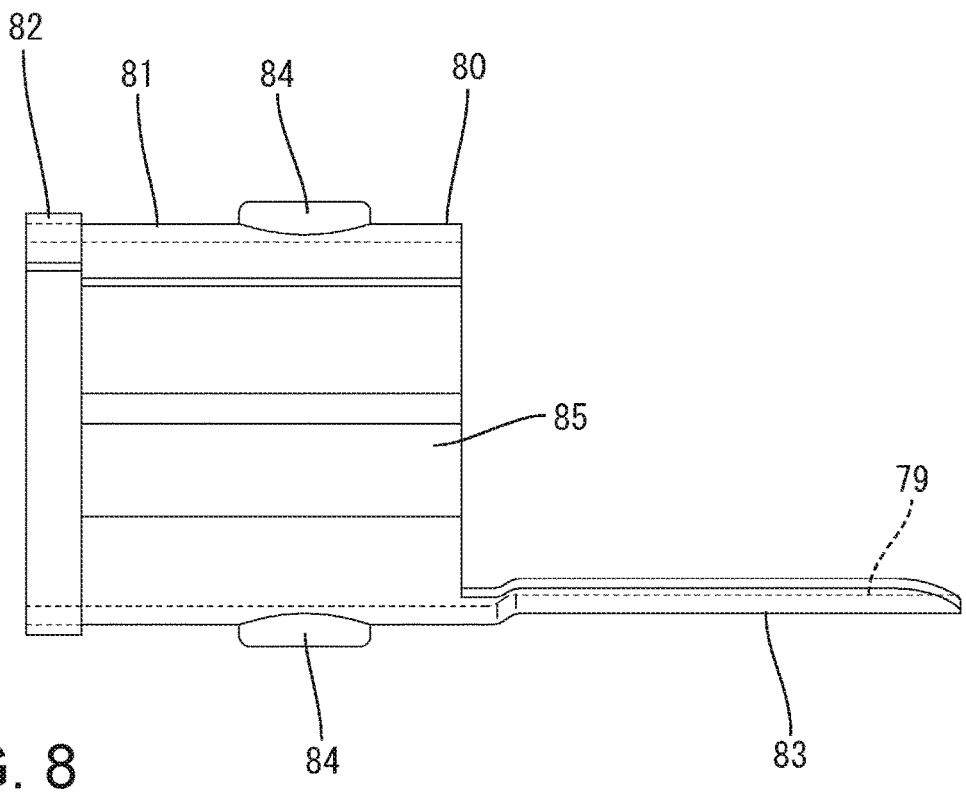
FIG. 8 is a side view of the positioning member.

Next, the positioning member 80 will be described. The positioning member 80 is made of a synthetic resin, and two positioning members 80 are provided as a pair at positions corresponding to the two lengthwise end portions of the shielding pipe 11. As shown in FIGS. 7 and 8, each positioning member 80 has a tube-shaped (specifically, cylindrical) tubular portion 81 that is open at the two ends in the axial direction (length direction of the shielding pipe 11), a step portion 82 that is shaped as a projecting rib and extends along the circumferential direction in the outer circumferential end portion of the tubular portion 81, an attachment piece 83 shaped as a band plate that projects from one end of the lower side portion, in the diagram, of the tubular portion 81 in a direction parallel with the axial direction, and locking projection portions 84 that are shaped as flattened circular columns and respectively project from the lower end portion and the upper end portion, in the diagram, of the outer circumferential surface of the tubular portion 81. The two above-described electrical wires 60 are inserted into the tubular portion 81, or more specifically, the sheaths 66 in the other end portions, in the length direction of the stranded wires 62, of the two electrical wires 60 are inserted into the tubular portion 81.

Two locking projection portions 84 are arranged as a pair at two ends in the diameter direction (upper and lower ends in the drawing) of the tubular portion 81. The locking projection portions 84 have a projecting dimension that slightly exceeds the depth dimension of the lock-receiving portions 25, the projecting end surface is flat, and the outer circumferential edge of the projecting end surface is chamfered over the entire circumference.

As shown in FIG. 5, the lengthwise end portions of the shielding pipe 11 are fitted around the tubular portions 81, and as shown in FIG. 6, the positioning members 80 are locked to the shielding pipe 11 due to the locking projection portions 84 elastically fitting into the lock-receiving portions 25 in a press-fitted state.

The step portion 82 is provided in portions excluding the upper and lower end portions, in the drawing, with respect to the circumferential direction. The locking projection portions 84 can be viewed between the portions of the step portion 82 on the left and right sides in a view from the axial direction. As shown in FIG. 5, the step portion 82 opposes and can abut against the lengthwise edge of the shielding pipe 11, and can define the attachment position of the shielding pipe 11 relative to the positioning member 80.

As shown in FIG. 6, a pair of clearance recessed portions 85 for avoiding interference with the protection wall 21 of the shielding pipe 11 are provided protruding inward at the two ends in the diameter direction (left and right ends in the drawing) of the tubular portion 81. The clearance recessed portions 85 are provided extending in the length direction in portions excluding the step portion 82 in the tubular portion 81, and bulge inward so as to be continuous with the same thickness as the portions that are adjacent in the circumferential direction. As shown in FIG. 7, thick portions 86 that bulge inward with a shape corresponding to the clearance recessed portions 85 are provided at positions that are continuous with the clearance recessed portions 85 on the step portion 82 of the tubular portion 81. The protection walls 21 of the divided bodies 12 are arranged so as to oppose and be able to abut against the thick portions 86. As shown in FIG. 6, each clearance recessed portion 85 has a curved portion 87 that curves along the curved surface 22 of the protection wall 21, and a straight portion 88 that is continuous with the inner end of the curved portion and extends in straight line while moving away from the curved surface 22 of the protection wall 21.

As shown in FIG. 8, the attachment piece 83 has a total length that slightly exceeds the total length (length in the axial direction) of the tubular portion 81, and extends from a position continuous with one end of the tubular portion 81, rises one time toward the central axis, and then extends in a straight line toward the leading end. As shown in FIG. 6, the attachment piece 83 has an arc-shaped cross-section that curves along the outer circumferential surface of an electrical wire 60, and the upper surface in the drawing (the surface that faces the central axis) is a curved support surface 79 that supports the electrical wire 60. In the state where the electrical wire 60 is placed on the support surface 79 of the attachment piece 83, tape 50 is wrapped around the two electrical wires 60 as a group from the lower surface, in the drawing, of the attachment piece 83 so as to span between the outer circumferential surfaces of the electrical wires 60. The electrical wires 60 are thus attached and fixed to the attachment piece 83. Note that the two electrical wires 60

(stranded wires 62) are held in a state of being stacked in the vertical direction, in the drawing, while being taped to the attachment piece 83.

Next, an example of a manufacturing method for the shielded conduction path 10 of the first embodiment will be described.

Prior to the operation of joining the two divided bodies 12, the exposed regions of the core wires 65 of the stranded wires 62 and the exposed regions of the core wires 63 of the single wires 61 are overlaid on each other, the overlaid portions are soldered, the stranded wires 62 are connected to the two lengthwise end portions of the single wires 61 to form the connection regions 67, and the protection members 68 are attached so as to cover the outer circumferential surfaces of the connection regions 67. Also, at an appropriate time, the one lengthwise end portions of the stranded wires 62 are connected to the corresponding device-side connectors 94 and 95 via terminal fittings (not shown).

Figure 2:
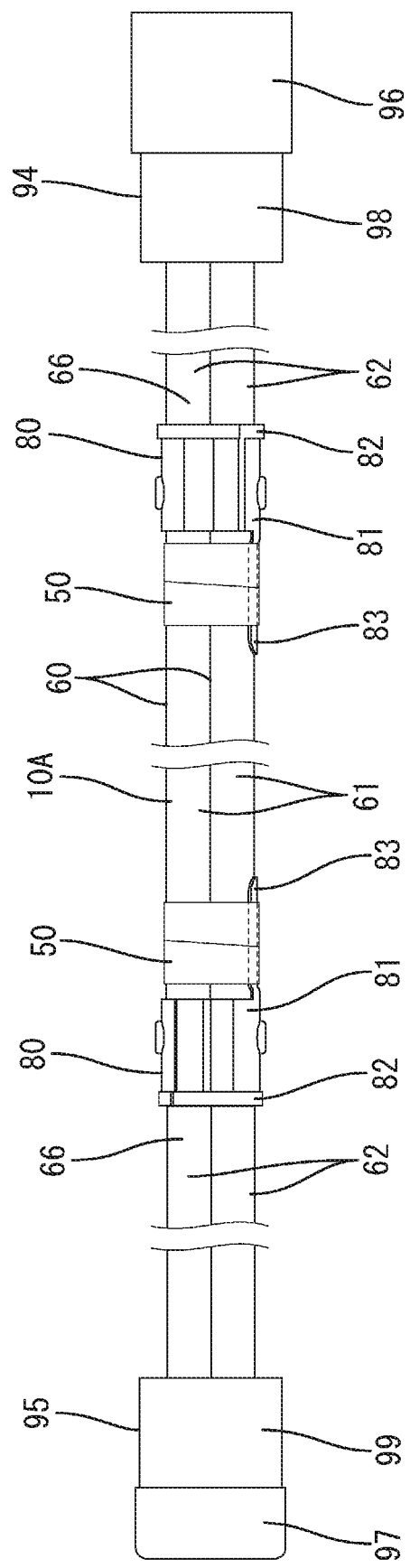
FIG. 2 is a side view of a state where positioning members have been attached to electrical wires.

Next, as shown in FIG. 2, the attachment pieces 83 of the positioning members 80 are attached, via tape 50, to predetermined positions on the sheaths 66 of the stranded wires 62 that are located on the two sides that sandwich the single wires 61. Specifically, the tape 50 is wrapped around the outer circumferential surfaces of the stranded wires 62 and the attachment pieces 83 as a group so as to span them. The two positioning members 80 are attached as a pair to the two lengthwise sides of the electrical wires 60, and the separation distance between the attachment positions of the two positioning members 80 is set to a length that corresponds to the total length of the shielding pipe 11. Accordingly, a shielded conduction path 10A in a semi-complete state is formed.

Next, one of the two divided bodies 12 is arranged so as to extend along the electrical wires 60, and the lengthwise end portions of the one divided body 12 are fitted around a semicircular region (e.g., the lower half region) of the tubular portions 81 of the corresponding positioning members 80. Accordingly, the locking projection portions 84 of the one divided body 12 are mated and locked with the lock-receiving portions 25, and the one divided body 12 is thus positioned relative to the electrical wires 60.

Then the other divided body 12 is arranged so as to extend along the electrical wires 60 on the side opposite to the one divided body 12, and the two lengthwise end portions of the other divided body 12 are fitted around the remaining semicircular region (e.g., the upper half region) of the tubular portions 81 of the corresponding positioning members 80. Similarly the above description, the locking projection portions 84 of the other divided body 12 are mated and locked with the lock-receiving portions 25, and the other divided body 12 is thus positioned relative to the electrical wires 60. When the divided ends (edge) 17 of the two divided bodies 12 abut against each other along the axial direction, the lapped regions 19 of the two divided bodies 12 are overlaid with the protection walls 21 in the inward-outward direction with the protection walls 21 on the inward side.

Next, the weld portions 24 are formed at the abutting portions 18 of the divided ends (edge) 17 of the two divided bodies 12 by performing laser welding or the like in a continuous manner over the entire length from the outward side. At this time, as shown in FIG. 6, the protection walls 21 are located between the abutting portions 18 of the divided ends (edge) 17 of the two divided bodies 12 and the electrical wires 60 in the shielding pipe 11, and thus the influence of heat from the welding is blocked by the protection walls 21, and the electrical wires 60 are protected.

Figure 3:
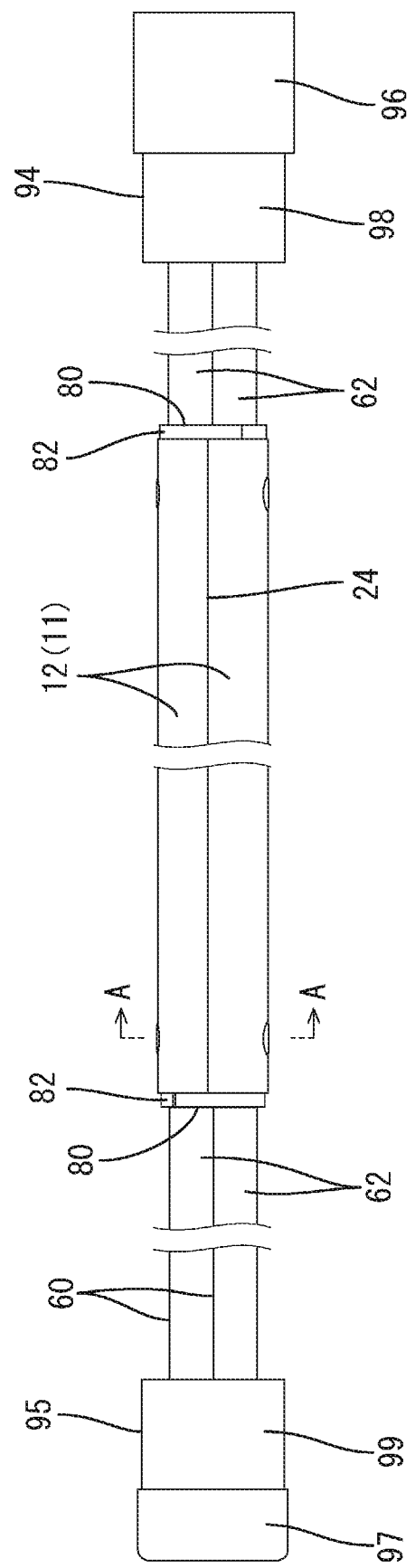
FIG. 3 is a side view of a state where a pair of divided bodies have been joined.

In this way, the pair of divided bodies 12 are joined together via the abutting portions 18 of the divided ends 17, and as shown in FIG. 3, the shielding pipe 11 shaped as a tube that extends in a straight line is formed. The single wires 61 are entirely, in terms of length, housed in the shielding pipe 11, and the connection regions 67 of the single wires 61 and the stranded wires 62 and the other lengthwise end portions of the stranded wires 62 are also housed therein.

Figure 4:
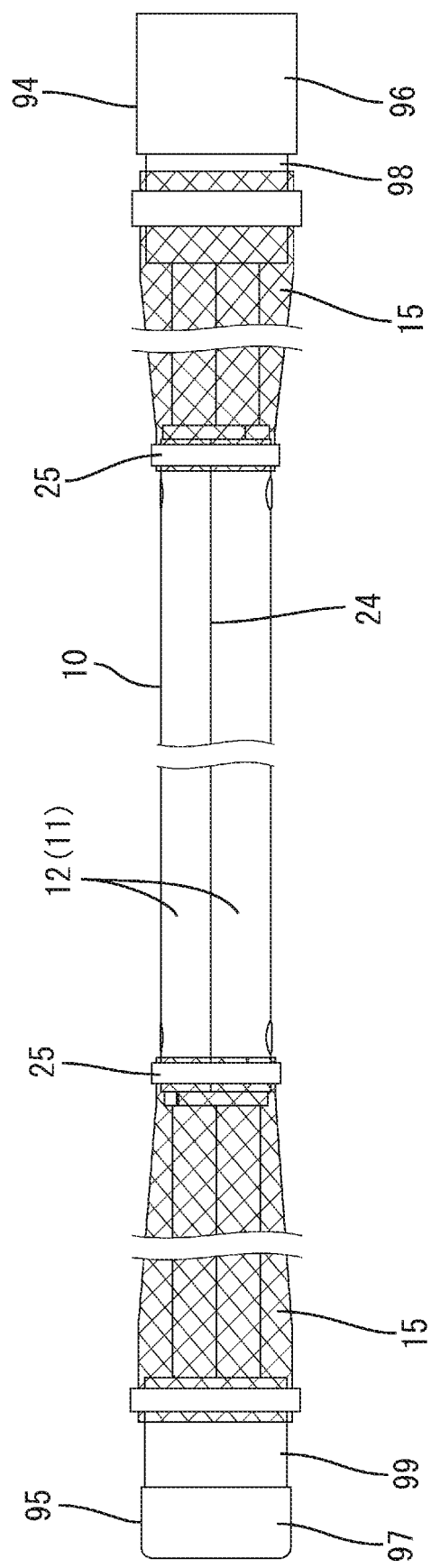
FIG. 4 is a side view of a state where braided members have been affixed.

Next, as shown in FIG. 4, the braided members 15 are placed on the two lengthwise end portions of the shielding pipe 11 and fixed with the metal bands 16. Accordingly, the portions of the stranded wires 62 that extend between the shielding pipe 11 and the device-side connectors 94 and 95 are shielded by the braided members 15.

Thereafter, the shielding pipe 11 is bent into a predetermined shape. At this time, the outer shape of the shielding pipe 11 is a true circle similarly to conventional technology, and therefore a conventionally-used pipe bending machine can be used as-is. Also, the pair of divided bodies 12 are held in a state of being tightly affixed by the weld portions 24, and therefore it is possible to reliably prevent a situation in which an opening unexpectedly forms in the abutting portions 18 when the bending is performed. As a result, it is possible to prevent exposure of the electrical wires 60 from the shielding pipe 11 and noise leakage. The shielding pipe 11 is thus plastically deformed into a predetermined shape by bending processing, and the pair of divided bodies 12 are held in the joined state.

As described above, the shielded conduction path 10 of the first embodiment includes the shielding pipe 11 that is shaped as a tube that surrounds the electrical wires 60 and is constituted by the pair of divided bodies 12 that have the divided ends 17 that extend along the length direction (axial direction), and the positioning members 80 that are locked to the pair of divided bodies 12 and are attached to the electrical wires 60. According to this configuration, due to the two divided bodies 12 being joined so as to sandwich the electrical wires 60 therebetween, the electrical wires 60 are housed in the shielding pipe 11 that is shaped as a tube, thus eliminating the need for an operation of inserting the electrical wires 60 into the shield pipe 11. Also, due to the positioning members 80 being locked to the divided bodies 12 in a state of being attached to the electrical wires 60, the positions of the divided bodies 12 relative to the electrical wires 60 are held at constant positions, thus making it possible to prevent positional shift of the two divided bodies 12 at the time of the joining operation or after being joined.

In particular, in the case of the first embodiment, the divided ends 17 of the pair of divided bodies 12 are sealed by the weld portions 24, thus achieving a significant advantage in that positional shift of the two divided bodies during the welding operation can be suppressed by the positioning members 80. Also, due to the weld portions 24 being formed on the abutting portions 18 of the divided ends 17 of the two divided bodies 12, it is possible to reliably prevent the formation of gaps between the divided ends 17 of the two divided bodies 12 when performing bending processing on the shielding pipe 11. As a result, there is an increase in the reliability of preventing exposure of the electrical wires 60 and noise leakage.

Also, the lapped regions 19 in which the pair of divided bodies 12 are overlaid in the inward-outward direction are provided, and the protection walls 21 that cover the abutting portions 18 of the divided ends 17 from the inward side of the shielding pipe 11 are provided on the inward side of the lapped regions 19, and therefore it is possible to prevent the electrical wires 60 in the shield pipe 11 from being influenced by heat generated during the operation of welding the weld portions 24.

Also, the electrical wires 60 are each constituted by a single wire 61 and the stranded wires 62 that are connected to the lengthwise end portions of the single wire 61, and the shielding pipe 11 covers the entire length of the single wires 61 and surrounds the connection regions 67 between the single wires 61 and the stranded wires 62, and therefore the single wires 61 that are relatively narrow and the connection regions 67 that are delicate in terms of strength are stably protected by the shield pipe 11.

Furthermore, the positioning members 80 have the tubular portions 81 that are shaped as a tube and extend along the inner circumferential surface of the shielding pipe 11, and the step portions 82 project from the outer circumferential surface of the tubular portions 81 and oppose the lengthwise edges of the pair of divided bodies 12, and therefore even if an edge is formed at axial-direction edges of the divided bodies 12, the edge can be hidden by the step portion 82, and it is possible to avoid the case where the edge interferes with a peripheral component or the like.

Furthermore, the locking projection portions 84 are provided on the outer circumferential surface of the tubular portions 81, and the lock-receiving portions 25 that receive the locking projection portions 84 are provided on the divided bodies 12, and therefore unlike the case where the locking projection portions 84 are provided on the inner circumferential surface of the tubular portion 81, the space for providing the electrical wires 60 in the shielding pipe 11 is not constrained, and the effective use of space is excellent.

Other Embodiments

The following is a brief description of other embodiments.

(1) Although the pair of divided bodies 12 are joined before bending processing is performed in the first embodiment, the present disclosure is not limited to this, and a configuration is possible in which divided bodies that have been bent into a predetermined shape are joined together.

(2) Although the shielding pipe 11 has a true circle cross-sectional shape in the first embodiment, the present disclosure is not limited to this, and the shield pipe may have a cross-sectional shape of an ellipse, an elongated circle, a polygon, or the like. In this case, it is sufficient that the tubular portions of the positioning members have a shape that corresponds to the shape of the shielding pipe.

(3) Although the lapped regions 19 (protection walls 21) are provided over the entire length in the first embodiment, the present invention is not limited to this, and the lapped regions (protection walls) may be provided in only a portion of the shielding pipe, or may be divided and provided intermittently at multiple locations.

(4) Although the positioning members 80 are made of a synthetic resin in the first embodiment, the present invention is not limited to this, and the positioning members may be made of a metal.

(5) Although the lock-receiving portions 25 are holes that penetrate the divided bodies 12 in the thickness direction in the first embodiment, the present invention is not limited to this, and the lock-receiving portions may be bottomed recessions that are open at only the inner surfaces of the divided bodies.

(6) Although the pair of divided bodies 12 have the same shape as each other in the first embodiment, the present invention is not limited to this, and the pair of divided bodies may have different shapes from each other. The term "pair of divided bodies" in the above description refers to two divided bodies that can be joined to each other, and does not necessarily refer to two divided bodies that have the same shape.

(7) Although the attachment pieces 83 of the positioning members 80 are attached to the electrical wires 60 by the wrapping of tape in the first embodiment, the present invention is not limited to this, and the attachment pieces of the positioning members may be attached to the electrical wires by a fixing member such as a cable tie.

(8) Although the weld portions 24 are formed by laser welding in the first embodiment, the present invention is not limited to this, and the weld portions may be formed by a known bonding means such as TIG welding or brazing.

(9) Although the electrical wires 60 are each constituted by a single wire 61 and stranded wires 62 in the first embodiment, the present invention is not limited to this, and the electrical wire may be entirely constituted by a stranded wire.

(10) Although the positioning members 80 are locked to the two lengthwise end portions of the shielding pipe 11 (pair of divided bodies 12) in the first embodiment, the present invention is not limited to this, and one positioning member may be locked to only one of the two lengthwise end portions of the shield pipe, or a positioning member may be locked at an intermediate portion in the lengthwise direction of the shielding pipe. In other words, it is sufficient that the shielding pipe is held in a state of being positioned relatively to the electrical wires via a positioning member.

(11) Although the divided ends of the two divided bodies are sealed by the weld portions in the first embodiment, the present invention is not limited to this, and the divided ends of the two divided bodies may be sealed by a locking mechanism provided in the divided bodies themselves.

(12) Although the shielding pipe 11 is made of a metal in the first embodiment, the present invention is not limited to this, and the shield pipe may be made of an electrically conductive resin or have a layered structure include a metal and a resin.

(13) Although the connection regions 67 are each formed by overlaying the exposed region of the core wire 63 of a single wire 61 and the exposed region of the core wire 65 of a stranded wire 62 in the first embodiment, the present invention is not limited to this, and the connection region may be formed by, for example, abutting the single wire against the core wires of the stranded wires and connecting them together.

| List of Reference Numerals | |
|---|---|
| 10 | Shielded conduction path |
| 11 | Shielding pipe |
| 12 | Divided body |
| 17 | Divided end |
| 18 | Abutting portion |
| 19 | Lapped region |
| 21 | Protection wall |
| 24 | Weld portion |
| 25 | Lock-receiving portion |
| 60 | Electrical wire |
| 61 | Single wire |
| 62 | Stranded wire |
| 67 | Connection region |
| 80 | Positioning member |
| 81 | Tubular portion |
| 82 | Step portion |
| 83 | Attachment piece |
| 84 | Locking projection portion |

The invention claimed is:

1. A shielded conduction path comprising:
a shielding pipe that is shaped as a tube that surrounds an electrical wire, the shielding pipe being divided axially into a pair of divided bodies, each divided body having a divided edge that extends along an axial direction; and
a positioning member that is locked to axial ends of the pair of divided bodies and is configured to be attached to the electrical wire,
wherein the positioning member is provided with an attachment piece attached to the electrical wire, and the attachment piece is housed inside of the shielding pipe.

2. The shielded conduction path according to claim 1, wherein the divided edges of the pair of divided bodies are sealed by a weld portion.

3. The shielded conduction path according to claim 2, wherein a lapped region in which the pair of divided bodies are overlaid is provided, the lapped region being a region in which the pair of divided bodies overlap in an inward-outward direction, and a protection wall that covers an abutting portion of the divided edges from an inward side of the shielding pipe is provided in the lapped region.

4. The shielded conduction path according to any one of claim 3,
wherein the electrical wire is constituted by a single wire and a stranded wire that is connected to a lengthwise end portion of the single wire, and the shielding pipe covers the single wire over an entire length of the single wire in a length direction, and surrounds a connection region of the single wire and the stranded wire.

5. The shielded conduction path according to any one of claim 2,
wherein the electrical wire is constituted by a single wire and a stranded wire that is connected to a lengthwise end portion of the single wire, and the shielding pipe covers the single wire over an entire length of the single wire in a length direction, and surrounds a connection region of the single wire and the stranded wire.

6. The shielded conduction path according to claim 5, wherein the positioning member has a tubular portion that is shaped as a tube and extends along an inner circumferential surface of the shielding pipe, and a step portion that projects from an outer circumferential surface of the tubular portion and opposes an axial-direction edge of the pair of divided bodies.

7. The shielded conduction path according to claim 6, wherein the positioning member has a tubular portion that is shaped as a tube and extends along an inner circumferential surface of the shielding pipe, a locking projection portion that is provided on an outer circumferential surface of the tubular portion, and the pair of divided bodies are provided with a lock-receiving portion that receives the locking projection portion.

8. The shielded conduction path according to claim 1, wherein the electrical wire is constituted by a single wire and a stranded wire that is connected to a lengthwise end portion of the single wire, and the shielding pipe covers the single wire over an entire length of the single wire in a length direction, and surrounds a connection region of the single wire and the stranded wire.

9. The shielded conduction path according to claim 8, wherein the positioning member has a tubular portion that is shaped as a tube and extends along an inner circumferential surface of the shielding pipe, and a step portion that projects from an outer circumferential surface of the tubular portion and opposes an axial-direction edge of the pair of divided bodies.

10. The shielded conduction path according to claim 9, wherein the positioning member has a tubular portion that is shaped as a tube and extends along an inner circumferential surface of the shielding pipe, a locking projection portion that is provided on an outer circumferential surface of the tubular portion, and the pair of divided bodies are provided with a lock-receiving portion that receives the locking projection portion.

11. The shielded conduction path according to claim 1, wherein the positioning member has a tubular portion that is shaped as a tube and extends along an inner circumferential surface of the shielding pipe, and a step portion that projects from an outer circumferential surface of the tubular portion and opposes an axial-direction edge of the pair of divided bodies.

12. The shielded conduction path according to claim 1, wherein the positioning member has a tubular portion that is shaped as a tube and extends along an inner circumferential surface of the shielding pipe, a locking projection portion that is provided on an outer circumferential surface of the tubular portion, and the pair of divided bodies are provided with a lock-receiving portion that receives the locking projection portion.

13. A shielded conduction path comprising:
a shielding pipe that is shaped as a tube that surrounds an electrical wire, the shielding pipe being divided axially into a pair of divided bodies, each divided body having a divided edge that extends along an axial direction; and
a positioning member that is locked to axial ends of the pair of divided bodies and is configured to be attached to the electrical wire,
wherein the positioning member has a tubular portion that is shaped as a tube and extends along an inner circumferential surface of the shielding pipe, and a step portion that projects from an outer circumferential surface of the tubular portion and opposes an axial-direction edge of the pair of divided bodies, the step portion including thick portions that bulge inward relative to other portions of the step portion.

* * * * *